(12) United States Patent
Yoon et al.

(10) Patent No.: US 6,204,102 B1
(45) Date of Patent: Mar. 20, 2001

(54) METHOD OF FABRICATING COMPOUND SEMICONDUCTOR DEVICES USING LIFT-OFF OF INSULATING FILM

(75) Inventors: Hyung Sup Yoon; Jin Hee Lee; Byung Sun Park; Chul Soon Park; Kwang Eui Pyun, all of Taejon (KR)

(73) Assignees: Electronics and Telecommunications Research Institute, Taejon; Korea Telecom, Sungnam-shi, both of (KR)

( * ) Notice: Subject to any disclaimer, the term of this patent is extended or adjusted under 35 U.S.C. 154(b) by 0 days.

(21) Appl. No.: 09/207,512

(22) Filed: Dec. 9, 1998

(30) Foreign Application Priority Data

May 29, 1998 (KR) .................................................. 98-19864

(51) Int. Cl.[7] .................................................. H01L 21/338
(52) U.S. Cl. .......................... 438/182; 438/577; 438/578; 438/579; 438/576; 438/574
(58) Field of Search ................................... 438/577, 578, 438/579, 576, 572, 574, 602, 604; 148/DIG. 100

(56) References Cited

U.S. PATENT DOCUMENTS

| | | |
|---|---|---|
| 5,053,348 | * 10/1991 | Mishra et al. . |
| 5,231,040 | * 7/1993 | Shimura . |
| 5,288,654 | 2/1994 | Kasai et al. . |
| 5,304,511 | * 4/1994 | Sakai . |
| 5,362,677 | * 11/1994 | Sakamoto et al. . |
| 5,486,483 | * 1/1996 | Lammert . |
| 5,583,063 | * 12/1996 | Samoto . |
| 5,766,967 | * 6/1998 | Lai et al. . |
| 5,856,232 | * 1/1999 | Yang et al. . |
| 5,858,824 | * 1/1999 | Saitoh . |
| 5,940,694 | * 8/1999 | Bozada et al. . |
| 5,940,697 | * 8/1999 | Yoo et al. . |
| 5,976,920 | * 11/1999 | Nakano et al. . |
| 6,025,613 | * 2/2000 | Bito et al. . |

OTHER PUBLICATIONS

I. Hanyu et al., "Super Low–Noise HEMTs with a T–Shaped $Wsi_x$ Gate", Electronics Letters, vol. 24, No. 21, Oct. 13, 1988, pp. 1327–1328.

E.Y. Chang et al., "Submicron T–Shaped Gate HEMT Fabrication Using Deep–UV Lithography", IEEE Electron Device Letters, Vo. 15, No. 8, Aug. 1994, pp. 277–279.

K. Hosogi et al., "Photo/EB Hybrid Exposure Process for T–Shaped Gate Superlow–Noise HEMTs", Electronics Letters, vol. 27, No. 22, Oct. 24, 1991, pp. 2011–2012.

* cited by examiner

Primary Examiner—John F. Niebling
Assistant Examiner—Jonathan Hack
(74) Attorney, Agent, or Firm—Jacobson, Price, Holman & Stern, PLLC

(57) ABSTRACT

A method of forming a gate electrode of a compound semiconductor device includes forming a first insulating film pattern having a first aperture, forming a second insulating film pattern having a second aperture consisting of inverse V-type on the first insulating film pattern, forming a T-type gate electrode by depositing a conductivity film on the entire structure, removing a second insulating film pattern, forming a insulating spacer on a pole sidewall by etching a first insulating film pattern, and forming an ohmic electrode of the source and drain by self-aligning method using T-type gate electrode as a mask. Thereby T-type gate electrode of materials such as refractory metals can be prevented to be deteriorate because of high annealing, as well as it is stably formed, by using an insulating film. Ohmic metal and gate electrodes formed by self-aligning method can be prevented an interconnection by forming an insulating film spacer between these electrodes.

16 Claims, 6 Drawing Sheets

METHOD OF FABRICATING COMPOUND SEMICONDUCTOR DEVICES USING LIFT-OFF OF INSULATING FILM

BACKGROUND OF THE INVENTION

1. Field of the Invention

The present invention relates to the fabrication field of semiconductor devices, and more particularly to a method for forming a gate electrode of a compound semiconductor device using lift-off an insulating film.

2. Description of the Related Art

FIGS. 1a to 1d are cross-sectional views showing a method of fabricating a field effect type compound semiconductor devices, such as high electron mobility transistor (HEMT) or metal semiconductor field effect transistor (MESFET), according to a conventional method.

First, as shown in FIG. 1a, a GaAs buffer layer 2, a AlGaAs/GaAs superlattice buffer layer 3, a channel layer 4, a spacer layer 5, a semiconductor layer 6, and a n type GaAs ohmic contact layer 7 are successively grown on the semi-insulating GaAs substrate 1.

Next, as shown in FIG. 1b, a resist consisting of deposited polymethylmethacrylate (PMMA) and co-polymer is deposited by spin coating on the GaAs ohmic layer 7. An electron beam irradiates the resist, which is developed to form a resist pattern having a T-type profile. The GaAs ohmic layer 7 is removed by dry etching using the resist pattern as a mask.

Next, as shown in FIG. 1c, Ti/Pt/Au metal film 9 is deposited on the resist pattern 8 and semiconductor layer 6. T-type gate electrode 10 is formed within the resist pattern 8 having a T-type profile.

Finally, as shown in FIG. 1d, as the metal film deposited the inside and top of the resist pattern is simultaneously removed by lift-off method, T-type gate electrode 10 and GaAs ohmic layer 7 are exposed. sequentially, Ohmic metal (AuGe/Ni/Au) electrode 11 of source and drain are produced by evaporation, self-aligning, using the T-type gate electrode 10 as a mask. AuGe/Ni/Au films are formed to a thickness of 1000Å to 2000 Å, 400Å to 1000Å, and 400Å to 1000Å, respectively. Sequentially, the field effect type compound semiconductor devices, such as HEMT, MESFET is accomplished by rapid annealing at the temperature of 430° C. for 20 sec.

As described above, the conventional semiconductor device is formed a resist pattern having a T-type profile using PMMA and co-polymer, sequentially deposited a metal film for gate electrode. In the case of deposition of the refractory metal on the resist pattern having a T-type profile in order to form the gate electrode, the refractory metal gate electrode is difficult to form stably due to melting of the resist. Also, the T-type gate electrode of materials such as Ti/Pt/Au shows an unstable device characteristics due to its deterioration, thereby annealing at the high temperature, after forming by self-aligning method an ohmic metal electrode.

In the formation process by self-aligning method a source and drain using the T-type gate electrode as a mask, the device reliability decreases due to the interconnection between gate and ohmic metal electrodes, because the insulating film is not formed at a lower part of gate electrode.

SUMMARY OF THE INVENTION

It is an object of the present invention to provide a method of fabricating a compound semiconductor device using lift-off an insulating film capable of forming to be stabilize a gate electrode.

It is a further object of the present invention to provide a method of fabricating a compound semiconductor device using lift-off an insulating film capable of preventing to be deteriorate a gate electrode. Another object of the present invention is to provide a method of fabricating a compound semiconductor device using lift-off an insulating film capable of preventing to be interconnect between gate and ohmic metal electrodes.

In accordance with one aspect of the present invention, a method of fabricating a semiconductor device comprises the steps of: a first step having a semiconductor layer; a second step forming a first insulating film pattern having a first aperture which make exposed said semiconductor layer; a third step forming a second insulating film pattern having a second aperture on said first insulating film pattern, wherein said second aperture is connected with said first aperture, and the width of said second aperture is wider than said first aperture; a fourth step depositing a conductivity film on the entire structure after a third step, and forming a T-type gate electrode touched with said semiconductor layer, wherein said T-type gate electrode consist of conductivity film deposited the inside of said first and said second apertures; a fifth step removing said second insulating film; and a sixth step, forming a insulating spacer on a pole sidewall of the conductivity film consisting of said gate electrode, wherein said first insulating film is etched to be remain behind said pole sidewall of the conductivity film.

In accordance with another aspect of the present invention, a method of fabricating a semiconductor device comprises the steps of: a first step forming a first semiconductor layer; a second step forming a second semiconductor layer on the entire structure after said first step; a third step forming a first oxide film having a first aperture which make exposed said second semiconductor layer; a fourth step forming a nitride film pattern having a second aperture and second insulating film pattern having a third aperture, wherein said second and third apertures are connected with said first aperture, said first and second apertures respectively, the width of said second aperture is wider than said first aperture, and the width of said third aperture is wider than said second aperture; a fifth step exposing said first semiconductor by removing said semiconductor layer exposed by said first aperture; a sixth step depositing a conductivity film on the entire structure after said fifth step, and forming a T-type gate electrode touched with a first semiconductor layer which is exposed said forth step, wherein said T-type gate electrode consist of conductivity film deposited the inside of said first and said second apertures; a seventh step removing said second oxide and nitride patterns; and a eighth step forming a insulating spacer on a pole sidewall of the conductivity film consisting of said gate electrode, wherein said first insulating film is etched to be remain behind said pole sidewall of the conductivity film.

BRIEF DESCRIPTION OF THE DRAWINGS

These and other objects, and features and advantages of the invention, as well as the invention itself, will become better understood by reference to the following detailed description of the presently preferred embodiments when considered in conjunction with the accompanying drawings, wherein.

DETAILED DESCRIPTION OF THE PREFERRED EMBODIMENTS

Figure 1A:
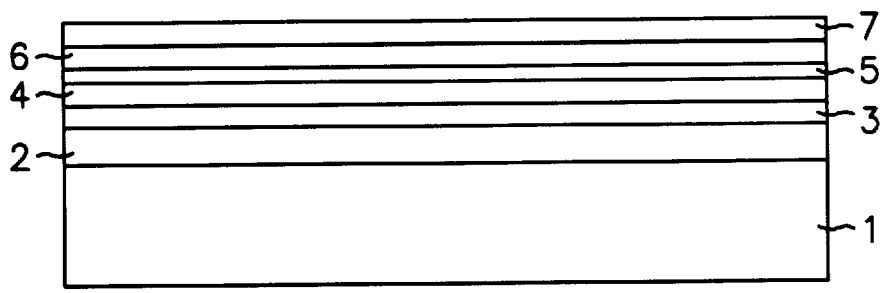
FIGS. 1a to 1d are cross-sectional views showing the process steps for fabricating a conventional compound semiconductor device.
Figure 1B:
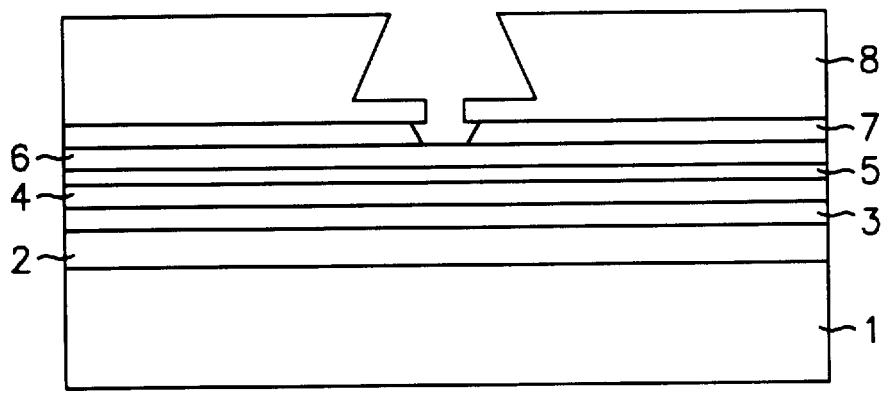
Figure 1C:
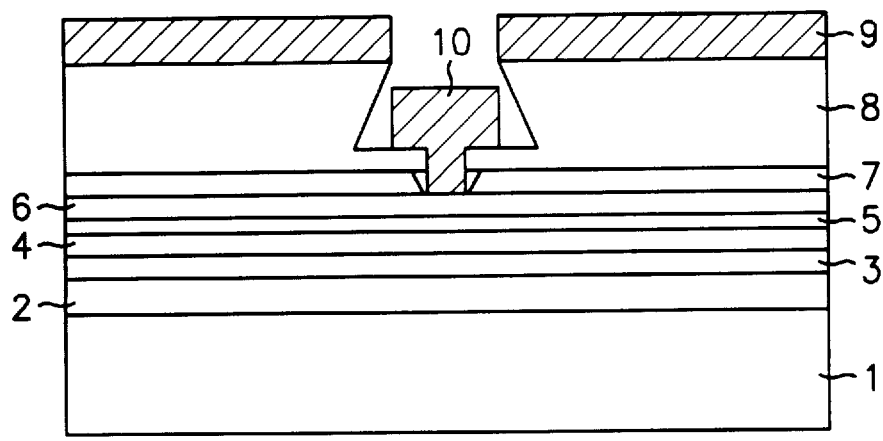
Figure 1D:
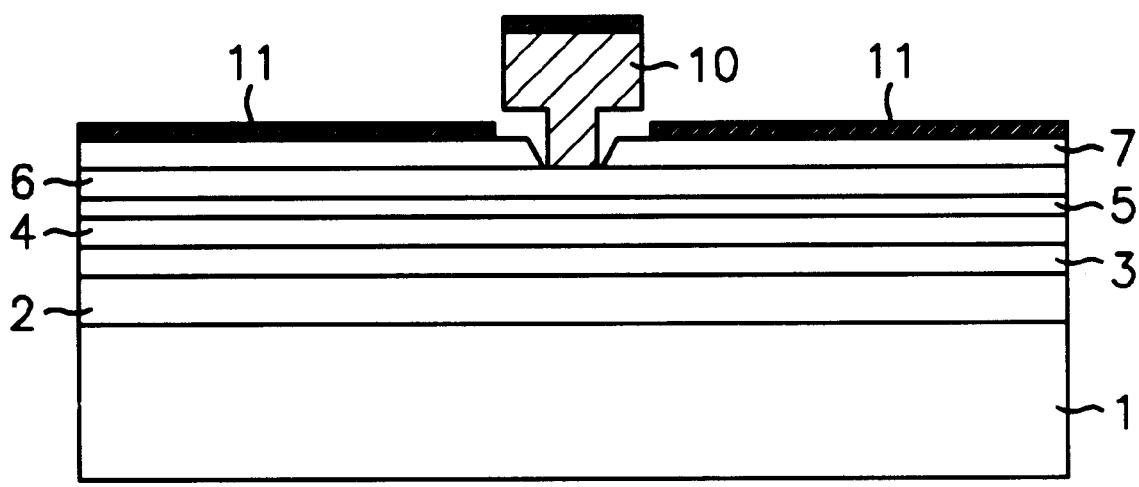

Embodiments of the invention will be explained with reference to the drawings.

FIGS. 2a to 2i are cross-sectional views showing the process steps for fabricating a compound semiconductor device using lift-off an insulating film according to a first embodiment of the present invention.

First, as shown in FIG. 1, a GaAs buffer layer 13, a InGaAs cannel layer 14, a spacer layer 15, a Si-delta doped layer 16, a AsGaAs layer 17, a $In_xAlAs_{1-x}$ etch-stop layer 18, and a n type GaAs ohm contact layer 19 are successively grown by metal organic vapor phase (MOVPE) or metal organic chemical vapor deposition (MOCVD) on the semi-insulating GaAs substrate 12. The composition x and thickness of the $In_xAlAs_{1-x}$ etch-stop layer 18 are 0.8 to 1 and about 15 Å, respectively.

Figure 2A:
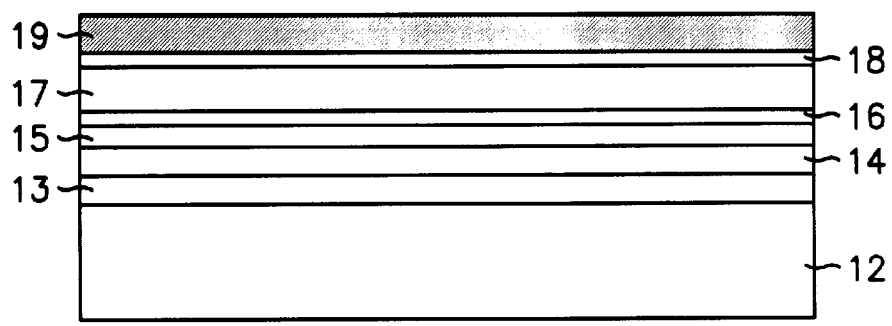
FIGS. 2a to 2i are cross-sectional views showing the process steps for fabricating a compound semiconductor device according to a first embodiment of the present invention.
Figure 2B:
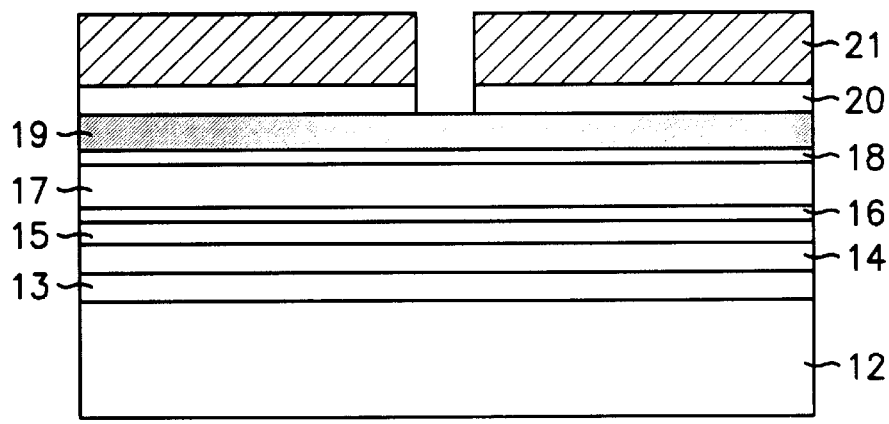

Next, as shown in FIG. 2b, a n type GaAs ohm contact layer 19, a $In_xAlAs_{1-x}$ etch-stop layer 18, a AlGaAs layer 17, a Si-delta doped layer 16, a spacer layer 15, a InGaAs cannel layer 14, a GaAs buffer layer 13, and a portion of semi-insulating GaAs substrate 12 are defined a active region by wet etching. Sequentially, a first oxide film having a thickness of about 2000 Å at the high temperature of 300° C. is deposited by plasma enhanced chemical vapor deposition (PECVD) on the n type GaAs ohmic contact layer 19. A PMMA resist is deposited on the first oxide. An electron beam irradiates the PMMA resist, which is developed to expose a portion of first oxide film, thereby, a first resist pattern 21 is formed. The first oxide film is selectively etched by dry etching using the resist pattern 21 as a mask for forming a first insulating pattern 20 having a first aperture to be expose the GaAs ohmic layer 19.

Figure 2C:
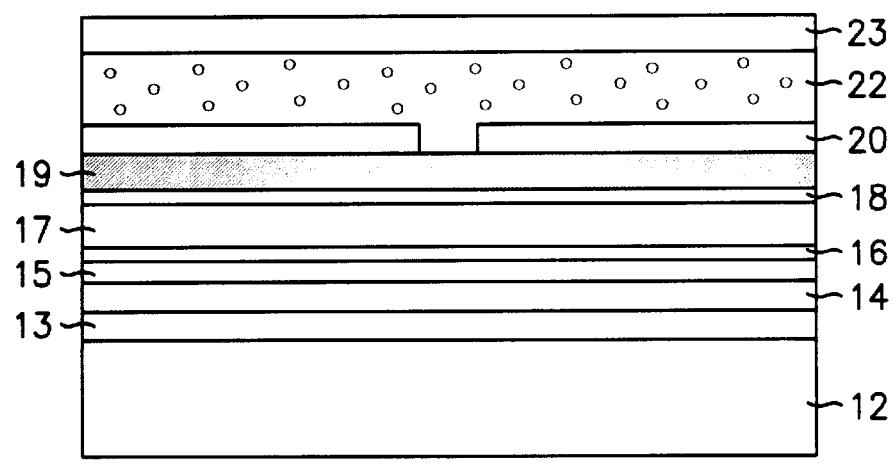

Next, as shown in FIG. 2c, the first resist pattern 21 is removed, and a nitride film 22 having a thickness of 600 Å at the low temperature of 50° C. to 100° C. by PECVD is formed on the oxide film 20 and the GaAs ohmic contact layer 19. A second oxide film 23 having a thickness of 1000 Å at the high temperature of 300° C. is deposited on the nitride film.

Figure 2D:
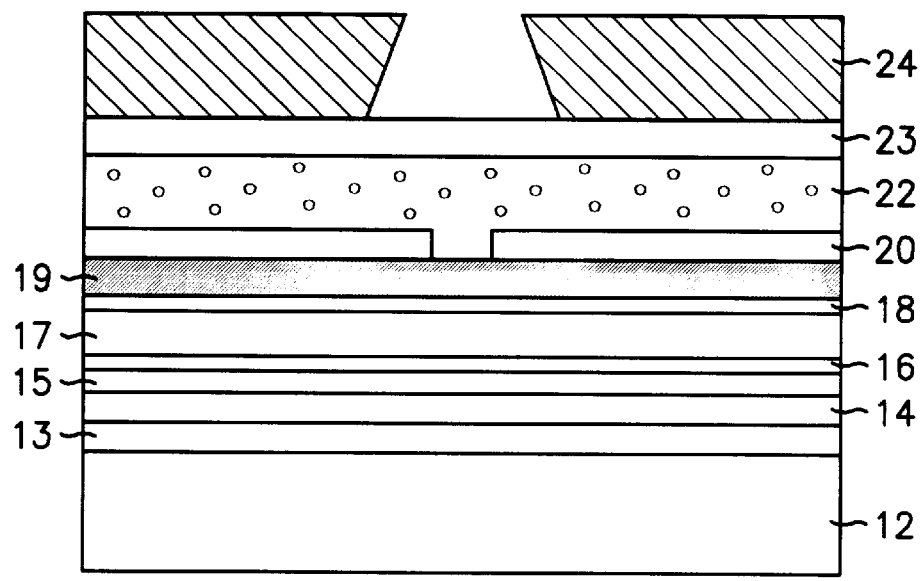

Next, as shown in FIG. 2d, as a second resist pattern having an aperture which the more go to the lower part, the more the width is wide, is formed by photolithography to be expose a portion of the second oxide film 23.

Figure 2E:
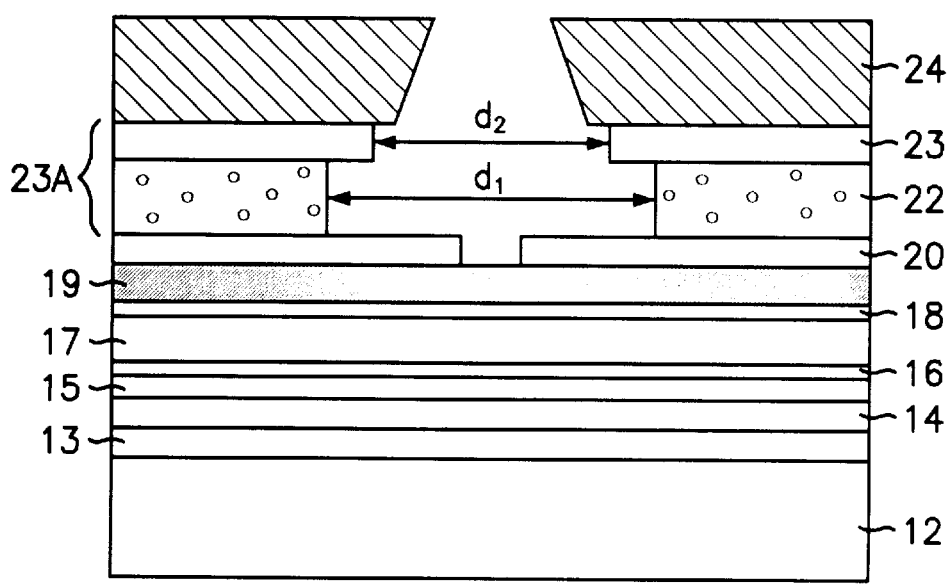

Next, as shown in FIG. 2e, the second oxide and the nitride films are etched by buffered oxide etchant (BOE) combined with NH4F 30:HF 1 using the second resist pattern as a mask. A second insulating layer pattern 23A having a second aperture of inverse V-type which is wider than the first aperture is formed simultaneously with exposure of the GaAs ohmic layer 19 by a first aperture of the first insulating pattern 20. Here, the etch rate of oxide versus nitride is above 100:1. That is, as the etching of the nitride film 22 is faster than the second oxide film 23, an aperture width (d1) of the nitride film 22 is wider than an aperture width (d2) of the second oxide film 23, therefore, the inverse V-type aperture is formed thereby. Also, the aperture of the nitride film 22 and first insulating film pattern 20 is formed to T-type.

Figure 2F:
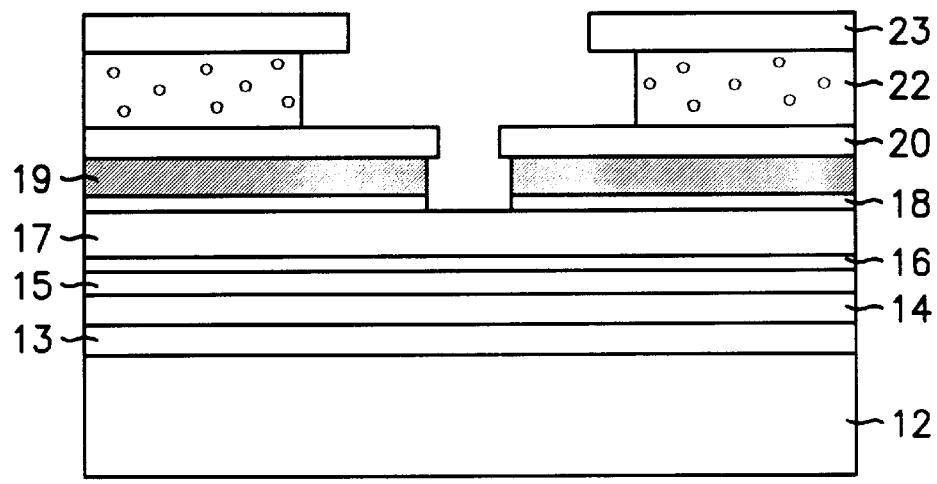

Next, as shown in FIG. 2f, after removing second resist pattern 24, the GaAs ohmic layer 19 is etched by citric acid diluted to C6H8O7 3:H2O 1, sequentially, the AlGaAs layer 17 is exposed as the $In_xAlAsl_{1-x}$ etch-stop layer 18 is etched by HCl diluted to HCl 15:H2O 1. A pole of the "T" type aperture consist of the etched nitride film 20, GaAs ohmic layer 19, and $In_xAlAs_{1-x}$ etch-stop layer 18.

Figure 2G:
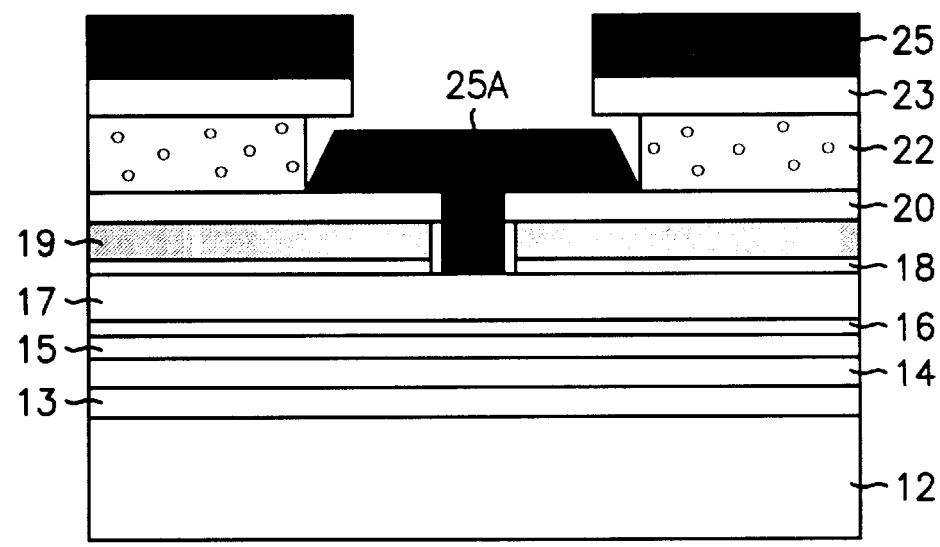

Next, as shown in FIG. 2g, a T-type gate electrode 25A is formed as a refractory metal 25 of materials, such as W, Mo, WNx, is deposited up to touch with AlGaAs layer 17 through the aperture of the etched nitride film 22, first oxide film 20, GaAs ohmic layer 19, and etch-stop layer 18, at the same time as on the second oxide film by sputtering.

Figure 2H:
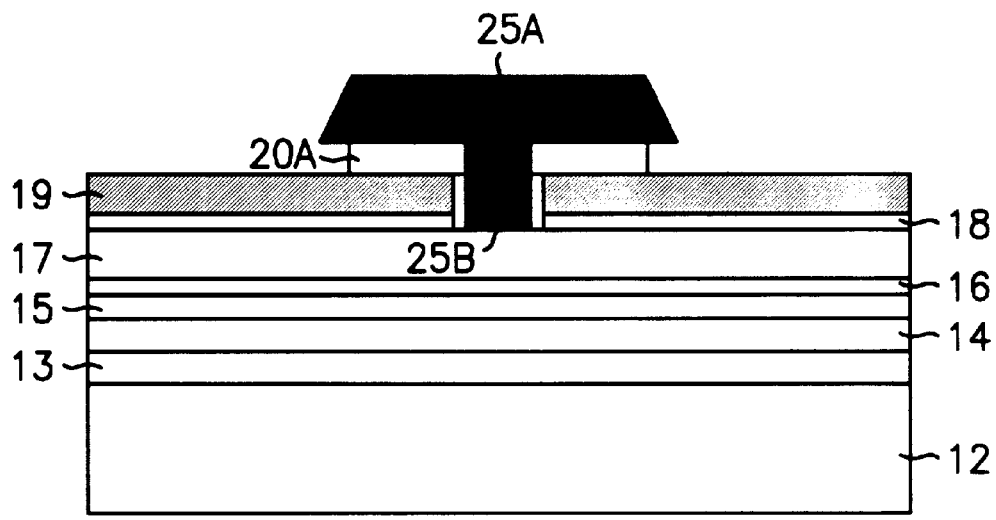

Next, as shown in FIG. 2h, The metal film 25 formed on the second oxide film 23 is removed by lift-off method the nitride 22 and the second oxide films, simultaneously a upper part of the T-type gate electrode 25A and first oxide film 20 are exposed. Both sides of the pole 25B of the T-type gate electrode 25A make remained behind the oxide film 20 by dry etching the exposed first oxide film 20. Sequentially, the oxide spacer 20A which undercut both sides of the pole 25B of the T-type gate electrode 25A is formed by etching a portion of oxide film using buffered oxide etchant (BOE) combined with NH4F 6:HF 1.

Figure 2I:
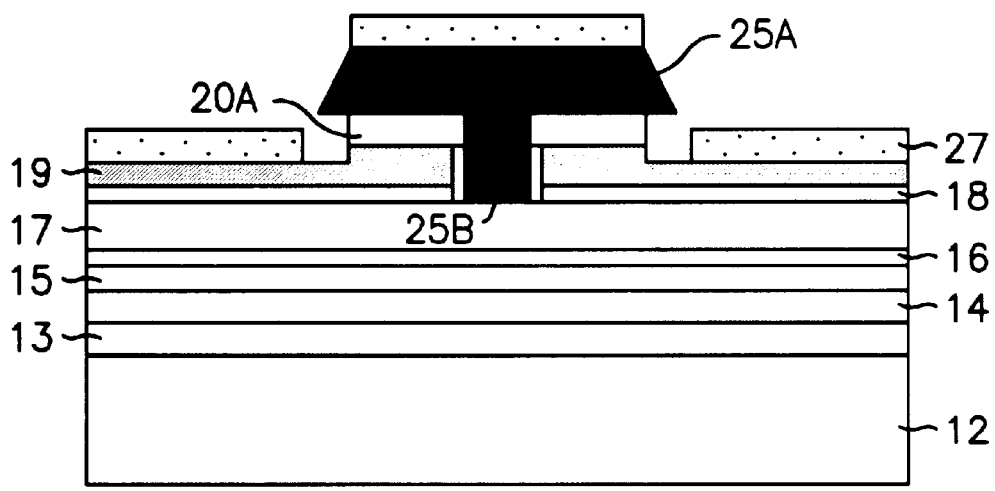

Finally, as shown in FIG. 2i, a portion of the GaAs ohmic layer 19 which damage by dry etching the first oxide film is removed by wet etching solution. Ohmic metal (Pd/Ni/Ge/Au/Ti/Au) electrode 27 of source and drain is produced by evaporation, self-aligning, using the T-type gate electrode 25A as a mask. Pd/Ni/Ge/Au/Ti/Au films are deposited to a thickness of 50 Å to 70 Å, 100Å to 200 Å, 300Å to 500 Å, 400Å to 600 Å, 100 Å to 200Å, and 700 Å to 1000Å, respectively. Sequentially, the field effect type compound semiconductor devices, such as HEMT, MESFET is accomplished by rapid annealing at the temperature of 400° C. to 450° C. for 30 sec.

Advantages of this invention are that the T-type gate electrode is stably formed by making lift-off an insulating pattern, and the reliability make elevated as the interconnection between ohmic metal and gate electrodes can be prevented by forming oxide spacer between these electrodes.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents. For example, Although the first embodiment of the present invention is formed to the multi-layer structure consisting of insulating film such as oxide and nitride, the insulating film can be formed by the single layer in consideration of a thickness of insulating film using for the lift-off and conductivity film.

What is claimed is:

1. A method of fabricating a semiconductor device comprising steps of:
    a) preparing a semiconductor layer;
    b) forming a first insulating film pattern having a first aperture which exposes a portion of said semiconductor layer;
    c) forming a second insulating film pattern having a second aperture on said first insulating film pattern and a third insulating film pattern having a third aperture on the second insulating pattern, wherein said second and third apertures are connected with said first aperture, the width of said third aperture is wider than that of said first aperture, and the width of said second aperture is wider than that of said third aperture;
    d) depositing a conductivity film on the entire structure after the step c), and forming a T-type gate electrode that touches said semiconductor layer, wherein said T-type gate electrode is formed with a conductive film and is deposited inside said first and second apertures;

e) removing said second insulating film; and f) forming an insulating spacer on a post of the conductive film by etching said first insulating film.

2. The method of fabricating a semiconductor device as defined in claim 1, wherein said first insulating film pattern is formed of an oxide film.

3. The method of fabricating a semiconductor device as defined in claim 2, wherein said step c) comprises:

c1) forming a nitride film on the entire structure after said step b);

c2) forming a second oxide film on said nitride film;

c3) forming an etching mask on said second oxide film;

c4) wet etching said second oxide and nitride films, and forming said second insulating film pattern, wherein said second insulating film pattern consists of said second nitride and nitride films, and is formed inverse V-type because the width of the aperture formed within said second oxide film is narrower than said nitride film; and c5) removing said etching mask.

4. The method of fabricating a semiconductor device as defined in claim 1, further comprising a step of forming an ohmic electrode by self-aligning method on said semiconductor layer after said step f).

5. A method of fabricating a semiconductor device comprising steps of:

a) forming a first semiconductor layer;

b) forming a second semiconductor layer on the entire structure after said step a);

c) forming a first oxide film having a first aperture which exposes a portion of said second semiconductor layer;

d) forming a nitride film pattern having a second aperture and a second insulating film pattern having a third aperture, wherein said second and third apertures are connected with said first aperture, the width of said third aperture is wider than that of said first aperture, and the width of said second aperture is wider than that of said third aperture;

e) exposing a portion of said first semiconductor by removing the portion of said second semiconductor layer exposed by said first aperture;

f) depositing a conductive film on the entire structure after said step e), and firming a T-type gate electrode that touches the first semiconductor layer which is exposed in step c), wherein said T-type gate electrode is formed with a conductive film and is deposited inside said first and said second apertures;

g) removing said second oxide and nitride patterns; and h) forming an insulating spacer on a post of the conductive film by etching said first insulating film.

6. The method of fabricating a semiconductor device as defined in claim 5, wherein said substrate is formed of a semi-insulating GaAs; said first semiconductor layer includes a GaAs buffer, a InGaAs cannel, a spacer, a Si-delta doped, a AlGaAs, and a $In_xAlAs_{1-x}$ etch-stop layers successively grown on said substrate; and said second semiconductor is formed of a GaAs ohmic layer.

7. The method of fabricating a semiconductor device as defined in claim 5, wherein said step d) comprises:

d1) forming a nitride film on the entire structure after said step c);

d2) forming a second oxide film on said nitride film;

d3) forming an etching mask on said second oxide film; and d4) wet etching said second oxide and nitride films, and forming said first oxide film and nitride film patterns.

8. The method of fabricating a semiconductor device as defined in claim 6, wherein x and thickness of said $In_xAlAs_{1-x}$ etch-stop layer are 0.8 to 1 and 15 Å, respectively.

9. The method of fabricating a semiconductor device as defined in claim 6, wherein said step e) comprises:

a step of removing said GaAs ohmic layer by etching with citric acid solution to expose said $In_xAlAs_{1-x}$ etch-stop layer; and a step of exposing said AlGaAs layer by etching said $In_xAlAs_{1-x}$ etch-stop layer with HCl solution.

10. The method of fabricating a semiconductor device as defined in claim 5, wherein said conductive film is selected from a group consisting of W, Mo, and WNx.

11. The method of fabricating a semiconductor device as defined in claim 5, further comprising a step of forming an ohmic electrode by self-aligning method on said second semiconductor layer after said step h).

12. The method of fabricating a semiconductor device as defined in claim 6, wherein said GaAs buffer, InGaAs cannel, spacer, Si-delta doped, AlGaAs, and $In_xAlAs_{1-x}$ etch-stop layers are formed by molecular beam epitaxy (MBE) or metal organic chemical vapor deposition (MOCVD).

13. The method of fabricating a semiconductor device as defined in claim 5, wherein said step c) comprises:

c1) forming a first oxide film having a thickness of 2000 Å at the high temperature of 300° C. by plasma enhanced chemical vapor deposition (PECVD) after said step b);

c2) coating a polymethlmethacrylate (PMMA) resist, irradiating the PMMA resist by electron beam, developing said PMMA resist, and forming a resist pattern which exposes a portion of said first oxide film;

c3) forming said first oxide pattern, thereby dry etching said first oxide film using said resist pattern as a mask; and c4) removing said resist pattern.

14. The method of fabricating a semiconductor device as defined in claim 7, wherein said nitride film is formed to 6000 Å thickness at a temperature of 50° C. 100° C. by PECVD; said second oxide film is formed in 1000 Å thickness at a temperature of 300° C. by PECVD; said etching mask is formed with an aperture; and said second oxide film and nitride film patterns are formed by wet etching said second oxide and nitride films.

15. The method of fabricating a semiconductor device as defined in claim 11, wherein said ohmic electrode is formed by successively depositing Pd, Ni, Ge, Au, Ti, and Au on the entire structure after said step h).

16. The method of fabricating a semiconductor device as defined in claim 7, further comprising a step of annealing rapidly after said step of depositing.

* * * * *